(12) United States Patent
Terada et al.

(10) Patent No.: US 6,245,822 B1
(45) Date of Patent: Jun. 12, 2001

(54) METHOD AND APPARATUS FOR DECOMPOSITION TREATING ARTICLE HAVING CURED THERMOSETTING RESIN

(75) Inventors: Takahiko Terada, Nara; Hiroshi Onishi, Hirakata, both of (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/299,049

(22) Filed: Apr. 23, 1999

(30) Foreign Application Priority Data

Apr. 27, 1998 (JP) .................................................. 10-116591
Nov. 4, 1998 (JP) .................................................. 10-312925

(51) Int. Cl.[7] .................................................... C08J 11/04
(52) U.S. Cl. .............................. 521/49; 521/40; 521/40.5
(58) Field of Search ............... 521/40, 40.5, 48, 521/49; 528/483; 264/37.1

(56) References Cited

U.S. PATENT DOCUMENTS

| 4,483,888 | * | 11/1984 | Wu ........................................ 427/336 |
| 4,711,026 | * | 12/1987 | Swiggett et al. ........................ 29/850 |
| 5,420,166 | * | 5/1995 | Tufts et al. ........................ 521/40.5 |
| 5,569,801 | * | 10/1996 | De Broqueville .................... 585/241 |
| 5,668,186 | * | 9/1997 | Brunelle et al. ........................ 521/48 |
| 5,776,989 | * | 7/1998 | Kubota et al. ........................ 521/48 |
| 5,969,009 | * | 10/1999 | Terada et al. ........................ 523/526 |

FOREIGN PATENT DOCUMENTS 10147621  6/1998  (JP).

* cited by examiner

*Primary Examiner*—Edward J. Cain
*Assistant Examiner*—Kat Wyrozebski Lee
(74) *Attorney, Agent, or Firm*—Akin, Gump, Strauss, Hauer & Feld, L.L.P.

(57) ABSTRACT

There is disclosed a method of decomposition treating a waste article having cured thermosetting resin comprising the steps of: (a) bringing the waste article having cured thermosetting resin into contact with a decomposing fluid containing a solvent, which can decompose the resin, in a decomposition bath and (b) heating the fluid at a temperature not lower than 250° C. and lower than the critical temperature of the solvent. Thereby, a waste article containing cured thermosetting resin is easily decomposed and waste resins and other components therein are recycled and reused as resources.

19 Claims, 3 Drawing Sheets

METHOD AND APPARATUS FOR DECOMPOSITION TREATING ARTICLE HAVING CURED THERMOSETTING RESIN

BACKGROUND OF THE INVENTION

The present invention relates to a method and an apparatus for decomposition treating waste articles having cured thermosetting resin as binder, which is excellent in strength and heat resistance and widely used as industrial material.

Thermosetting resins such as unsaturated polyester resin and epoxy resin have been used in molding compounds, laminated plates, adhesives, paints and the like, because they are easy to mix with fillers and inorganic additives and reinforced by fibers.

Those thermosetting resins are crosslinked by curing reaction to have a three-dimensional structure and generally become an insoluble and non-meltable solid. Since it is difficult to decomposition treat the cured thermosetting resin, those cured thermosetting resin wastes have been disposed of as not suitable for recycling and reuse.

With the waste disposal problem getting serious in recent years, meanwhile, there has arisen necessity of recycling those cured thermosetting resin wastes, prompting research and development of technology for recycling the waste resins as raw materials by thermal decomposition. For example, fiber-reinforced unsaturated polyester resin is widely used in large structures such as fishing boats, tanks and housing materials, and it is a serious problem how to dispose their wastes.

Cured thermosetting resins are distinguished by their hardness, strength, heat resistance, inflammability, chemical resistance and other properties. Those advantageous features have in return made their waste disposal technologically difficult.

Because of their strength, thermosetting resins are widely used as structural material, often with such materials as metal. Since metals are higher in price than thermosetting resins, it is more important to recycle and reuse such metals.

Though small in size, on the other hand, copper-coated laminated plates and IC molds containing epoxy resin, phenol resin or the like as binder further contain such noble metals as copper, gold, silver and the like in addition to paper, fiber and the like. That is, separation of those metals is needed in addition to the decomposition treatment of thermosetting resin wastes.

However, the conventional treating techniques were insufficient for recycling those metallic components as resources for reuse.

In view of those problems, the object of the present invention is to promote recycling the cured thermosetting resin wastes as resource for reuse, which the prior art has attempted with limited success.

In concrete, it is an object of the present invention to provide a simple method and apparatus for decomposition treating waste articles containing cured thermosetting resins to reuse those waste resins and other components therein as resources.

BRIEF SUMMARY OF THE INVENTION

The present invention is a method of decomposition treating a waste article having cured thermosetting resin comprising the steps of: (a) bringing the waste article having cured thermosetting resin into contact with a decomposing fluid containing a solvent, which can decompose the cured thermosetting resin when heated, in a decomposition bath and (b) heating the decomposing fluid at a temperature not lower than 250° C. and lower than the critical temperature of the solvent.

The decomposing fluid may be vaporized and, then, brought into contact with the waste article after vaporized.

In this method, it is preferable to include a step (a') of removing oxygen from the decomposition bath after the step (a) and before the step (b).

Also preferably, the step (a') comprises the steps of replacing the gas in the decomposition bath with nitrogen gas and/or evacuating the bath to reduce the internal pressure thereof.

As the solvent suitable for use in the step (a), there are solvents which decompose the cured thermosetting resin by solvolysis or catalytic action.

As the solvent to decompose the cured thermosetting resin by solvolysis, there are, for example, at least one solvent selected from the group consisting of ethylene glycol, propylene glycol, diethylene glycol, dipropylene glycol, isoprene glycol, triethylene gylocol, tetraethylene glycol, 2-methoxyethanol, 2-ethoxyethanol, 2-dimethoxyethanol, 2-isopropoxyethanol, 2-buthoxyethanol, 2-isopenthyloxyethanol, 2-hexyloxyethanol, 2-phenoxyethanol, 2-benzyloxyethanol, 1-methoxy-2-propanol, 1-ethoxy-2-propanol, diethylene glycol monomethyl ether, diethylene glycol monoethyl ether, diethylene glycol monobutyl ether, dipropylene glycol monomethyl ether, dipropylene glycol monoethyl ether, triethylene glycol monomethyl ether and tripropylene glycol monomethyl ether.

As the solvent to decompose the cured thermosetting resin by catalytic action, there are, for example, at least one solvent selected from the group consisting of tetralin, biphenyl, napthalene, 1,4-hydroxynaphthalene, naphthol, 1,4-naphthoquinone, pitch, creosote oil, methyl isobutyl ketone, isophorone, 2-hexanone, 2-heptanone, 4-heptanone, diisobutyl ketone, acetonyl acetone, phorone, cyclohexanone, methylcyclohexanone and acetophenone.

The decomposing fluid in the step (a) preferably contains calcium oxide. The content is preferably not higher than 10 parts by weight per 100 parts by weight of the solvent in the decomposing fluid.

The method also preferably further comprises, after the step (b), a step (f) of neutralizing the decomposing fluid, which contains calcium oxide, by adding carbon dioxide to a solution obtained in the step (a).

Furthermore, the decomposing fluid in the step (a) preferably contains an antioxidant or a reducing agent.

As such an antioxidant or reducing agent, there are, for example, at least one selected from the group consisting of hydroquinone, methoquinone, benzoquinone, naphthoquinone, butyl catechol, butyl hydroquinone, sodium hypophosphite, sodium thiosulfate and ascorbic acid.

The cured thermosetting resin in the step (a) may be at least one selected from the group consisting of cured unsaturated polyester resin, cured epoxy resin, cured phenol resin, cured polyurethane resin and amino resin.

As the waste article in the step (a), there is, for example, a molded motor or a molded transformer, which contains a metallic component. And, also, the waste article may be laminated resin article obtained by laminating and molding prepregs, each of which is prepared by impregnating with a thermosetting resin at least one base material selected from the group consisting of a fabric or non-woven fabric comprising glass fiber, polyester fiber, polyamide fiber, acrylic fiber or aramid fiber, paper such as mica paper or linter paper, cotton fabric and asbestos.

As such laminated resin article, there is a printed circuit board having a copper pattern formed thereon and an electronic device mounted thereon.

In this method, the step (b) is preferably followed by a step (c) of separating solid contents from liquid contents of a mixture of a heated cured thermosetting resin and a decomposing fluid, a step (d) of obtaining a solution by dissolving the separated solid contents, and a step (e) of separating residual solid contents from the solution.

In step (d), it is possible to dissolve the separated solid contents in at least one selected from the group consisting of acetone, acetylacetone, acetaldehyde, ethyl acetoacetate, methyl acetoacetate, methyl ethyl ketone, diethyl ketone, methyl isobutyl ketone, methyl isopropyl ketone, dimethyl sulfoxide, dimethyl formamide, ethyl acetate, isopropyl acetate, butyl acetate, tetrahydrofuran, dioxane, diethyl ether, water, ethanol and methanol.

Further, the present invention also concerns an apparatus for decomposition treating a waste article having cured thermosetting resin. The apparatus comprises a decomposition bath, which holds a waste article having cured thermosetting resin and a decomposing fluid containing a solvent to decompose the cured thermosetting resin, a means for heating the decomposing fluid to a temperature not lower than 250° C. and lower than the critical temperature of the solvent, which is provided to the decomposition bath, a second bath for separating solid contents from liquid contents of a mixture obtained in the decomposition bath, and a third bath for dissolving and separating a residual solid content obtained in the second bath.

Additionally, the decomposition treating apparatus preferably comprises a means for feeding the waste article having cured thermosetting resin and the decomposing fluid containing the solvent to decompose the cured thermosetting resin, a means for mixing and continuously extruding the fed waste article and solvent, and a means for heating the waste article and solvent in the extruding means. The extruding means is preferably capable of applying shearing stress to the waste article and solvent.

DETAILED DESCRIPTION OF THE INVENTION

Figure 1:
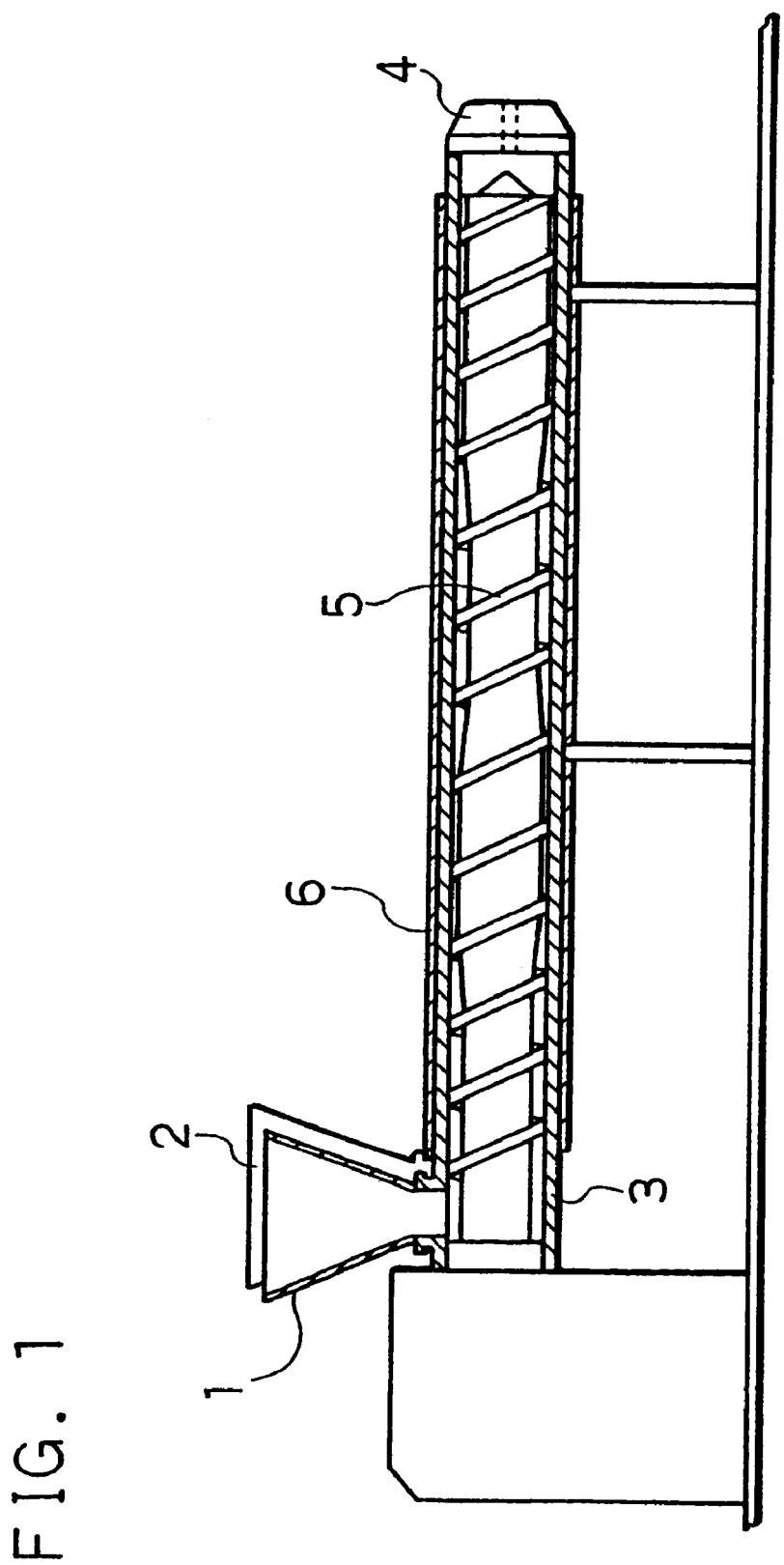
FIG. 1 is a schematic vertical, sectional view of an apparatus for decomposition treating articles having cured thermosetting resin according to the present invention.

The present invention is a method of decomposition treating a waste article having cured thermosetting resin comprising the steps of (a) bringing the waste article having cured thermosetting resin into contact with a decomposing fluid containing a solvent, which decomposes the cured thermosetting resin, in a decomposition bath and (b) heating the decomposing fluid at a temperature not lower than 250° C. and lower than the critical temperature of the solvent.

In first, the waste article having cured thermosetting resin, which is the object for the decomposition treating method in accordance with the present invention.

The waste article having cured thermosetting resin to be decomposition treatment of the present invention contains a thermosetting resin as binder. That is, the waste article is one produced by compounding a thermosetting resin with filler, base material, additives and the like to obtain a composite and, then, by curing the composite through curing reaction.

As such thermosetting resin, there are unsaturated polyester resin, phenol resin, epoxy resin, polyurethane resin, melamine resin, urea resin and the like. No restrictions in particular are imposed on the method and conditions for manufacturing those thermosetting resins. For example, the polymerization ratio of monomer components may be selected arbitrarily.

As the epoxy resin, there are, for example, a bisphenol A type epoxy resin, a glycidyl ether type epoxy resin and the like.

The unsaturated polyester resin may be obtained in a conventional manner from dibasic acid such as maleic anhydride, adipic acid or the like, dihydric alcohol such as ethylene glycol or the like, and vinyl monomer such as styrene, hydroxyethyl acrylate, hydroxyethyl methacrylate or the like.

Of the unsaturated polyester resins, the preferable is one comprising at least unsaturated polyester, shrinkage controlling agent and at least one addition-polymerizable monomer selected from the group consisting of styrene, hydroxyethyl acrylate and hydroxyethyl methacylate.

Needless to say, no restriction is imposed on the concentration and mixing ratio of the unsaturated polyester and shrinkage controlling agent.

Examples of waste articles made with unsaturated polyester resin as binder are ; molded articles of BMC (bulk molding compound), SMC (sheet molding compound) and the like which contain filler, thickener, releasing agent, wax, colorant and the like, lining materials which contain glass flake, glass fiber and the like, paints mixed which contain wax and the like, putty which contains filler and the like, resin concrete which contains aggregate, filler and the like, artificial marble which contains filler, pigment and the like, foamed material which contains foaming agent and the like, and adhesives which contain curing agent, stabilizer and the like.

The thermosetting resin may be one used as bulk molding compound, SMC in the form of sheet or PMC (pelletized type molding compound) in the form of pellet.

Fillers and aggregates in the waste article having the cured thermosetting resin include inorganic material type and organic material type.

Among the inorganic materials are carbonates such as calcium carbonate, magnesium carbonate and the like, sulfates (sulfites) such as calcium sulfate, barium sulfate, calcium sulfite and the like, silicates such as clay, mica, glass balloon, monmorillonite, silicic acid, kaolin, talc and the like, oxides such as silica, diatomaceous earth, iron oxide, pumice balloon, titanium oxide, alumina and the like, hydroxides such as aluminum hydroxide, magnesium hydroxide and the like. The inorganic materials also include graphite, glass fiber, carbon fiber, asbestos fiber and the like.

Example of the organic materials are wood meal, chaff, cotton, paper chip, polyamide (Nylon) fiber, polyethylene fiber, wood, pulp, cellulose and the like.

As the thickener, there are, for example, beryllium oxide, magnesium oxide, magnesium hydroxide, calcium oxide, calcium hydroxide, zinc oxide, benzoic acid, phthalic anhydride, tetrahydrophthalic anhydride and maleic anhydride.

Examples of the releasing agent are stearic acid, zinc stearate, calcium stearate and the like.

As the wax, there are, for example, Hoechst wax, carnauba wax, paraffin and the like.

As the colorant, there are, for example, titanium white, chromium oxide, carbon black and the like.

As the article having unsaturated polyester resin as binder, the molded article, adhesive and paint and the like which contain filler, base material, additives and the like.

Also, as the article having polyurethane resin as binder, there are, for example, foamed material, paint, adhesive and the like which contain the same additives as in the case of that having unsaturated polyester resin as binder.

Examples of the article having phenol resin as binder include the followings in addition to the waste articles similarly in the case of the waste articles having unsaturated polyester resin as binder. Namely, there are laminated resin articles obtained by laminating and molding prepregs, each of which is prepared by impregnating a resole type phenol resin into at least one base material such as a fabric or non-woven fabric comprising glass fiber, polyamide fiber, acrylic fiber, polyester fiber or asbestos.

The laminated resin article is turned into copper-coated laminated plate by laminating an adhesive-coated copper foil on the resin article, followed by molding. The laminated resin article also may be a printed circuit board with a conductive pattern formed and an electric device mounted thereon.

The waste article may be a printed circuit board manufactured from the copper-coated laminated plate by means of the steps of circuit printing and etching. In that case, resist is also decomposed by the decomposition treatment of the present invention.

As the article having epoxy resin as binder, in addition to the examples for those having unsaturated polyester resin as in the case of phenol, there is a laminated resin article obtained by laminating prepregs, each of which is prepared by impregnating epoxy resin into a base material such as a fabric or non-woven fabrics of glass fiber, polyester fiber, polyamide fiber, acrylic fiber or aramid fiber, a paper such as mica paper or linter paper. In this case, too, the article is turned into copper-coated laminated plate by laminating an adhesive-coated copper foil thereon, followed by molding.

The waste article made using thermosetting resins as polyimide resin as binder can be decomposition treated by the method of the present invention.

Also, a molded motor and molded transformer, which contain metallic components such as coil, core material and the like comprising copper and/or iron, may be the object to be decomposition treated by the method of the present invention.

As the waste article that can be decomposition treated by the method of the present invention, there are, for example, building materials such as bath tub, stool, toilet bowl, water reservoir, basin and the like, household articles such as desk, chair, furniture and the like, construction materials such as tile, artificial marble, pipe and the like, bodies and parts of ships, automobiles, trains, aircraft and the like, housing equipment, decorative laminated sheets, ornaments and the like.

The state and form of the thermosetting resin in those waste articles are not restricted and may be used as paint, putty, adhesive or the like.

The waste article that may be decomposition treated by the method of the present invention may be ones manufactured by a conventional known curing and molding method such as compression molding, transfer molding, injection molding or the like.

Hereinafter, the present invention will be explained step by step to facilitate the understanding thereof.

In the step (a) in first, the waste article having cured thermosetting resin to be decomposition treated by the method of the invention is brought into contact with a decomposing fluid containing a solvent, which can decompose the cured thermosetting resin in the decomposition bath when heated in the below step (b).

The decomposing fluid comprises the solvent, which decomposes the cured thermosetting resin.

Namely, the present inventors found out that when the solvent is heated to a certain temperature and brought into contact with the cured thermosetting resin, trunk chain and/or crosslinked chain of the cured thermosetting resin can be cut or broken and completed the present invention.

As the solvent, there are two types of solvent. One may cut or break the trunk chain and/or crosslinked chain by solvolysis and the other may cut or break the trunk chain and/or crosslinked chain by catalytic action.

In the present invention, the term "solvolysis" means the process that the solvent molecule cuts or breaks the trunk chain and/or crosslinked chain and, then, is bonded to the cut portions of the thermosetting resin, which is just like the process of hydrolysis. In the catalytic action, on the other hand, the solvent molecule merely exhibits a catalytic function to cut or break the trunk chain and/or crosslinked chain and is merely be bonded to the cut portions of the thermosetting resin.

The solvents that decompose the cured thermosetting resin by solvolysis may be at least one selected from the group consisting of ethylene glycol, propylene glycol, diethylene glycol, dipropylene glycol, isoprene glycol, triethylene gylocol, tetraethylene glycol, 2-methoxyethanol, 2-ethoxyethanol, 2-dimethoxyethanol, 2-isopropoxyethanol, 2-buthoxyethanol, 2-isopenthyloxyethanol, 2-hexyloxyethanol, 2-phenoxyethanol, 2-benzyloxyethanol, 1-methoxy-2-propanol, 1-ethoxy-2-propanol, diethylene glycol monomethyl ether, diethylene glycol monoethyl ether, diethylene glycol monobutyl ether, dipropylene glycol monomethyl ether, dipropylene glycol monoethyl ether, triethylene glycol monomethyl ether and tripropylene glycol monomethyl ether.

Of those compounds, ethylene glycol and propylene glycol are preferable because of their good solvolysis property, availability and low cost.

The solvent which decompose the cured thermosetting resin by catalytic action may be at least one solvent selected from the group consisting of tetralin, biphenyl, napthalene, 1,4-hydroxynaphthalene, naphthol, 1,4-naphthoquinone, pitch, creosote oil, methyl isobutyl ketone, isophorone, 2-hexanone, 2-heptanone, 4-heptanone, diisobutyl ketone, acetonyl acetone, phorone, cyclohexanone, methylcyclohexanone and acetophenone.

Among them, tetralin and isophorone are preferable because internal pressure of the decomposition bath at the decomposition treatment may be decreased. Further, tetralin is more preferable because it has reducing property and may prevent the metallic components or the like contained in the waste article having the cured thermosetting resin from oxidizing.

It is also preferred that the decomposing fluid contains not only the solvent but also an antioxidant or reducing agent to further ensure the prevention of the metallic components and the like, which are contained in the solvent and the waste article, from oxidizing and degrading.

Among such antioxidants or reducing agents, at least one selected from the group consisting of hydroquinone, methoquinone, benzoquinone, naphthoquinone, butyl catechol, butyl hydroquinone, sodium hypophosphite, sodium thiosulfate and ascorbic acid are exemplified, because they have high solubility in the aforesaid solvent and effect in preventing the solvent and metallic component from oxidizing and degrading.

Of those compounds, hydroquinone and methoquinone are preferable because of their good performance as anti-oxidant.

In the viewpoint that functions as antioxidant and reducing agent, the amount of the antioxidant or reducing agent is 0.2 to 10 parts by weight per 100 parts by weight of the solvent in the decomposing fluid. The amount is preferably 1 to 5 parts by weight in view of stable solubility of the decomposing fluid.

When the solvent, which cuts or breaks the trunk chain and/or crosslinked chain of the thermosetting resin by solvolysis, is used, it is desirable to add calcium oxide to the decomposing fluid.

In this case, when the solvent cuts or breaks the trunk chain and/or crosslinked chain of the thermosetting resin, calcium oxide acts as catalyst especially to facilitate solvolysis at condensed bond portions through condensation such as ester bond, ether bond and the like.

Calcium oxide is added in not larger than 10 parts by weight per 160 parts by weight of the solvent to accelerate and facilitate each decomposition reaction without becoming impurities in the thermosetting resin to be recycled. The amount is preferably 0.5 to 5 parts by weight in the viewpoint that the solubility into the decomposing fluid is good and it is relatively easy to conduct neutralizing treatment in the below-described step (f).

In this connection, in case calcium oxide is added, it is preferred to add carbon dioxide to the decomposing fluid and neutralize the same in the step (f), which will be described later, in consideration of quality of the thermosetting resin, metallic component and the like to be recycled.

As to the composition bath, a conventional known one will employed.

In the step (a), the waste article having cured thermosetting resin in the decomposition bath may be just in contact with the decomposing fluid containing the solvent. To carry out the decomposition treatment efficiently, it is desirable to immerse or dip the whole waste article having cured thermosetting resin in the decomposing fluid containing the solvent.

In the next step (b), the decomposing fluid, which is in contact with the waste article having cured thermosetting resin is heated to a temperature not lower than 250° C. and lower than the critical temperature of the solvent. This heating step is to facilitate the decomposition reaction and increase the decomposition rate. It is desirable that the temperature of the decomposing fluid should be high. At a temperature not lower than 250° C., the reaction is greatly accelerated.

But if the temperature is too high, so will the pressure. Then, the decomposition bath would have to be designed to be strong enough. Besides, decomposition gas would arise too much to recover, and the solvent in the decomposition bath would also decompose. On this ground, it is desired that the temperature of the decomposing fluid should be under the critical temperature of the solvent. Propylene glycol, for example, is 351° C. in critical temperature.

The solvent may be vaporized earlier and, then, brought into contact with the waste article.

Since the solvent is stable at a high temperature and is hardly decomposed to give oxygen or oxidize metallic component contained in the thermosetting resin, it is not necessary a pre-treatment step to remove oxygen. But in the case that slightest oxidation of metallic component or others in the cured resin could be a problem or in the case that the life of the decomposing fluid should be extended, a pre-treatment step to remove oxygen may be carried out.

That is, it is desirable to place a step (a') to remove oxygen in the decomposition bath between the step (a) and the step (b).

This step may be carried out by a conventional method. But the pre-treatment can also be effected as by providing a gas inlet pipe and an outlet valve in the decomposition bath, which holds the waste article and the decomposing fluid, and by introducing nitrogen gas directly from a nitrogen gas cylinder.

It is also possible to evacuate the decomposition bath to remove the gas therein to reduce the internal pressure. In this method, an outlet valve is provided in the decomposition bath, which holds the waste article and the decomposing fluid, and is connected to a vacuum pump. It is desirable to evacuate to as low a level as possible, preferably 10 mmHg or lower.

In either of the methods, the oxygen removal can be facilitated by stirring or heating the decomposing fluid properly.

While any method will do as long as oxygen in the decomposition bath can be removed, it is preferred to use both of those two methods. That is, the gas in the decomposition bath is first replaced with nitrogen gas, and then nitrogen gas is evacuated from the bath to reduce the internal pressure of the bath.

The pre-treatment to remove oxygen before the decomposing step can prevent oxidation, which is the main cause to degrade the decomposing fluid in a high temperature treatment, and can extend the life of the decomposing fluid for further repeated use. The pre-treatment step also would prevent metals and the others in the waste article from oxidizing and degrading, improving the quality of materials to be separated and recovered, too.

It is also preferable that the method of the present invention includes, after the step (b), the step (c) of separating solid contents from liquid contents of a mixture, which contains a cured thermosetting resin heated and a decomposing fluid, the step (d) of obtaining a solution by dissolving the separated solid contents, and the step (e) of separating residual solid contents from the solution.

In the step (c), with respect to the mixture of the heated cured thermosetting resin and the decomposing fluid, the solid contents such as metallic components, inorganic filler, solid residue of the decomposed thermosetting resin are separated from the liquid contents such as the decomposing fluid, the solvent and the decomposed thermosetting resin, which is soluble into the decomposing fluid.

In step (d), the separated solid contents (for example, decomposed thermosetting resin such as bisphenol A-epichlorohydrin resin in the case of epoxy resin) are dissolved into a solution.

The separated solid contents can be dissolved in at least one selected from the group consisting of acetone, acetyl acetone, acetaldehyde, ethyl acetoacetate, methyl acetoacetate, methyl ethyl ketone, diethyl ketone, methyl isobutyl ketone, methyl isopropyl ketone, dimethyl sulfoxide, dimethyl formaldehyde, ethyl acetate, isopropyl acetate, butyl acetate, tetrahydrofuran, dioxane, diethyl ether, water, ethanol and methanol.

In step (e), residual solid contents such as metallic components, inorganic filler, base material such as glass fiber, and the like are separated from the solution.

Thus, the three-dimensional crosslinked chain and/or trunk chain of the cured thermosetting resin can be cut or broken by bringing the waste article having cured thermosetting resin into the decomposing fluid containing the solvent. When decomposed, the cured thermosetting resin loses the function of a binder and collapses. That is, the cured thermosetting resin can not hold the filler, base material, additive and other components that the resin has bound by curing itself. And, the thermosetting resin and other components can be separated without difficulty. The thermosetting resin itself decomposes and can be recovered as monomer. The respective components are separated in the form of solid content, oil or solute depending on the solubility.

The method of decomposition treating the cured thermosetting resin in accordance with the present invention can easily decompose the waste article having thermosetting resin as binder, which have been difficult to treat in the past. After decomposition, furthermore, it is possible to recover the resin, filler, base material, additives and their components.

The present invention also relates to an apparatus for use in the method of decomposition treating cured thermosetting resin.

Further, the present invention also concerns an apparatus for decomposition treating a waste article having cured thermosetting resin. The apparatus comprises a decomposition bath, which holds a waste article having cured thermosetting resin and a decomposing fluid containing a solvent to decompose the cured thermosetting resin, a means for heating the decomposing fluid to a temperature not lower than 250° C. and lower than the critical temperature of the solvent, which is provided to the decomposition bath, a second bath for separating solid contents from liquid contents of a mixture obtained in the decomposition bath, and a third bath for dissolving and separating a residual solid content obtained in the second bath.

In addition, the apparatus preferably includes a means for feeding the waste article having cured thermosetting resin and the decomposing fluid containing the solvent to decompose the cured thermosetting resin, a means for mixing and continuously extruding the fed waste article and solvent, and a means for heating the waste article and solvent in the extruding means.

Especially to improve the efficiency of decomposition processing, the extruding means is preferably capable of applying shearing stress to the waste article and solvent.

The extruding means may serve as decomposition bath, too. Namely, the waste article and the decomposing fluid may be mixed in the extruding means.

In the decomposition bath having an extruding function, it is feared that the gases produced in heating would make it difficult to extrude the mixture of the waste article and the decomposing fluid. It is preferable, therefore, to provide a gas release section. In the gas release section, a condenser may be installed to recover gases.

In detail, in the decomposition treating apparatus of the present invention, the waste article and the decomposing fluid containing the solvent are fed and, then, kneaded and extruded while heating. That is, the apparatus can continuously decomposition treat the waste article having thermosetting resin as binder.

The heating temperature in the apparatus is preferably not lower than 250° C. and lower than the critical temperature of the solvent as mentioned earlier in the description.

The extrusion may be effected by rotation of a uniaxial or biaxial screw, pumping or the like. Especially when a uniaxial or biaxial screw is used, the efficiency of decomposition treatment can be improved by mixing and stirring the waste article and the decomposing fluid while applying shearing stress.

Furthermore, if a plurality of disks are mounted on the screw rotating shaft perpendicularly to the axis, the decomposition efficiency can be raised because the shearing stress goes up as the mixture of the cured resin and the decomposing fluid is forced through the gaps formed by the disks while the mixture is extruded by the rotating screw. The pressure to extrude the waste article and the decomposing fluid, extruding rate, distance and others may be set depending on the time required for decomposition reaction.

The decomposing fluid can be replenished to further facilitate decomposition reaction by providing a means for additionally feeding the decomposing fluid to the mixture of the waste article and the decomposing fluid being heated and extruded.

To facilitate the reaction in the decomposing fluid, it is preferable that the waste article to be fed into the apparatus is larger in surface area. It is preferable, therefore, to provide a crushing means as preliminary step before the waste article is fed into the apparatus.

The decomposition treating apparatus of the present invention brings the waste article into contact with the decomposing fluid containing the solvent, heats the fluid to a temperature not lower than 250° C. and lower than the critical temperature of the solvent. Then, the insoluble contents are separated from the decomposing fluid (solid-liquid separation). The separated insoluble contents are further dissolved and separated into the soluble contents and the insoluble contents.

The apparatus can decompose cured resins and separate the components in the cured resin after decomposition. The cured resin is immersed or dipped into the decomposing fluid to cut or break the trunk chain and/or three-dimensional crosslinked chain of the thermosetting resin. As the thermosetting resin is decomposed, its function as binder diminishes, with the cured resin collapsing. And the cured resin can not longer hold the filler, base, additives etc. which the resin has bound by curing itself.

When the solid (insoluble) contents are separated in the solid-liquid separation step, most of the filler, base material, additives, binders and others are recovered except for the components soluble in the decomposing fluid.

Then, the insoluble contents are further dissolved and separated into components of the binder thermosetting resin, and other components including the filler, base material and additives for reuse.

The solid-liquid separation means may be filtration, centrifuging or the like. Centrifuging can be effected using a centrifugal separator such as the cylinder type, separation plate type or decanter type.

As mentioned earlier, the solid contents are dissolved and separated using at least one selected from the group consisting of acetone, acetyl acetone, acetaldehyde, ethyl acetoacetate, methyl acetoacetate, methyl ethyl ketone, diethyl ketone, methyl isobutyl ketone, methyl isopropyl ketone, dimethyl sulfoxide, dimethyl formaldehyde, ethyl acetate, isopropyl acetate, butyl acetate, tetrahydrofuran, dioxane, diethyl ether, water, ethanol and methanol.

Those compounds exhibit a strong solubility for thermosetting resins.

Furthermore, in the case that calcium oxide is added to the decomposing fluid to facilitate the reaction, the fluid containing an non-reacted residue of calcium oxide can be neutralized with carbon dioxide as mentioned earlier.

For example, the fluid containing calcium oxide can be easily neutralized by blowing in carbon dioxide into the solvent to convert carbon dioxide into calcium carbonate while stirring. Calcium carbonate produced can be reused as inorganic filler after the separation by dissolving. Neutralization can also be effected by blowing a gas or air containing carbon dioxide or exhaust gas from a boiler, or by placing dry ice directly in the bath. Any of those will serve the purpose as long as carbon dioxide is contained.

Of the components coming out from the decomposition reaction in the decomposition treatment or apparatus of the present invention, those soluble in the decomposing fluid can be separated as by a step such as extraction, and the solvent can be reused as decomposing fluid.

It is noted that waste article using polyester resin fibers or the like as base material or filler are high in solubility, because those materials are dissolved along with cured thermosetting resin by the decomposition treating method and apparatus. In such waste article, the decomposed components can also be separated and recovered by the decomposing and processing apparatus of the present invention, and can be reused as material.

Now, the present invention will be further explained in detail by examples, but the present invention is not limited thereto.

EXAMPLES

Examples 1 to 3 and Comparative Example 1 and 2

First, 65 parts by weight of unsaturated alkyd prepared of phthalic anhydride, fumaric anhydride and propylene glycol was mixed with 35 parts by weight of styrene. Then, 0.01 parts by weight of a polymerization inhibitor methoxyhydroquinone was added, and the mixture was stirred and dissolved at room temperature to give an unsaturated polyester resin.

Meanwhile, 36 parts by weight of polydipropylene adipate was mixed with 64 parts by weight of 2-hydroxyethyl methacylate, and the mixture was stirred and dissolved to produce a shrinkage controlling agent.

Then, 26 parts by weight of the shrinkage controlling agent and one part by weight of a polymerization initiator 1,1-(t-butylperoxy)3,3,5-trimethylcyclohexane were added to 74 parts by weight of the unsaturated polyester resin prepared above. The mixture was stirred and mixed to produce a liquid resin composition.

In the next step, 17.8 parts by weight of filler calcium carbonate, 48.5 parts by weight of aluminum hydroxide, 1.5 parts by weight of a releasing agent zinc stearate and 0.4 parts by weight of a colorant carbon powder were transferred into a kneading machine to dry blend for about 5 minutes.

The homogeneously blended dry mixture thus obtained was kneaded by adding 22 parts by weight of the resin composition prepared earlier little by little to produce a homogenous pasty mixture.

Into this pasty mixture, 9.8 parts by weight of glass fibers were evenly dispersed in as short a time as possible. When the glass fibers got wet and dispersed uniformly, the kneading was finished and a molding compound with the thermosetting resin as binder was obtained.

The molding compound thus prepared is a kind of bulk molding compound so-called BMC and is not adhesive though it contains a solvent.

The molding compound was compression molded into a cured thermosetting resin cylinder of 20 mm in diameter at a mold temperature of 150° C. under a pressure of 35 kgf/cm$^2$.

The test samples prepared that way were dipped in a decomposing fluid containing only propylene glycol for 5 hours at different temperatures, 200° C. (Comparative Example 1), 200° C. (Comparative Example 2), 250° C. (Example 1), 300° C. (Example 2) and 350° C. (Example 3). Those samples were put to decomposition treatment by the method of the present invention.

In the test, measurements were taken of the penetration rate of decomposing fluid and the surface hardness of the cured thermosetting resin after decomposition treatment. The hardness was determined by the rubber hardness tester. The test results are shown in FIG. 1.

TABLE 1

|  | Temp.(° C.) | Depth per 5 h(mm) | Hardness(°) |
| --- | --- | --- | --- |
| Ex.1 | 250 | not less than 10 | impossible |
| Ex.2 | 300 | not less than 10 | impossible |
| Ex.3 | 350 | not less than 10 | impossible |
| Com.Ex.1 | 150 | 0 | 98 |
| Com.Ex.2 | 200 | 0.1 | 97 |

As is evident from the table, when the samples of the waste article having cured thermosetting resin were treated at 250 to 350° C., the decomposing fluid of propylene glycol penetrated deep into the cured thermosetting resin. Then, hardness was decreased too much and it was impossible to measure the hardness by the rubber hardness meter. That indicated that the cured unsaturated polyester resin was chemically decomposed and the sample articles could not maintain their structure and collapsed.

As shown, articles made with cured unsaturated polyester resin as binder can be decomposed in the decomposing fluid prepared of propylene glycol.

In the decomposition treatment at 250 to 350° C., the penetration rate of the decomposing fluid was high and the hardness of the resin decreased remarkably unlike in the comparative examples at 150 to 200° C.

In the comparative examples where decomposition treatment was carried out at 150 to 200° C., the decomposing fluid was slow to penetrate into the cured thermosetting resin with the hardness hardly observed to fall. That is, while cured thermosetting resins collapsed in the treatment with the decomposing fluid at a temperature not lower than 250° C., little decomposition takes place at a temperature lower than 250° C.

Those examples are concerned with bulk molding compounds. As mentioned earlier, the molding compound may be sheet molding compounds (SMC) or pelletized type molding compounds (PMC). This is also true of the examples which will be described later.

Example 4

In this example, molded motor was decomposed.

First, molded motor was produced by using the molding compound prepared in Example 1. An electromagnetic laminated steel plate with a electromagnetic coil put thereon was placed in a mold, and the molding compound was injected at a molding temperature of 150° C. to obtain a molded motor as an article having cured thermosetting resin. The largest molded portion thickness in the motor was 10 mm.

Then, the molded motor was dipped in a decomposing fluid of ethylene glycol with calcium oxide at 300° C. The content of calcium oxide in the decomposing fluid was 1 part by weight per 100 parts by weight of ethylene glycol. After dipping for 5 hours, the molded motor was taken out. The cured thermosetting resin portion in the motor was embrittled and could be peeled off without difficulty. And the electromagnetic parts like the electromagnetic coil and the laminated steel place could be easily recovered from the molded motor.

Examples 5 to 7 and Comparative Example 3

The same molded motors as in Example 1 were immersed in four different decomposing fluids, which were prepared by adding 0.5 part by weight (Example 5), 5 parts by weight (Example 6), 10 parts by weight (Example 7) and 15 parts by weight (Comparative Example 3) of calcium oxide per 100 parts by weight of ethylene glycol and were heated for 5 hours at 300° C.

The fluid with not larger than 10 parts by weight of calcium oxide could easily break up the molded motor into such electromagnetic parts such as coil and laminated steel plate.

It is noted that too much use of calcium oxide is not preferable, because residual calcium oxide could be impurities in the cured thermosetting resin to be recovered for reuse.

The molded motors treated in the fluid containing 15 parts by weight of calcium oxide per 100 parts by weight of ethylene glycol were found to have much calcium oxide remaining unused around the cured thermosetting resin. And the thermosetting resin was difficult to remove.

As is indicated by the results of Examples 5 to 7 and Comparative Example 3, the cured unsaturated polyester resin in the molded motors decreases in hardness in a decomposing fluid of ethylene glycol and calcium oxide to such an extent that the resin can be peeled off by hand.

That way, recyclable metals such as copper and iron as in the electromagnetic coil and laminated steel plate can be recovered without difficulty.

In the present examples, the molded motors were put to decomposition treatment in the original form. Such pre-treatments as rough crushing and cutting may be performed before the decomposition. Such pre-treatments could make the cured thermosetting resin portion thinner and thus shorten the time for immersion in the decomposing fluid.

Cracks in the molded motor also would open up new outer surfaces and reduce the surface wall thickness of the cured thermosetting resin portion. Mere cuts made by chisel or the like on the motor could facilitate the decomposition treatment.

After decomposition treatment of the molded motor, the cured thermosetting resin portion may be peeled and separated by hand using chemical-resistant gloves or a tool like spatula and mold. Water jet with high pressure may be useful in removing the resin.

Those are all applicable to the examples that will be described hereinafter.

Example 8

In this example, laminated plate formed with epoxy resin and phenol resin as binder were put to decomposition treatment.

A kraft paper was impregnated with phenolic varnish and then heated to evaporate the solvent to produce a prepreg. This prepreg was cut in pieces. Those pieces were laminated and thrust into the press, heated and pressed thereby curing phenol resin. Thus, a laminated plate was obtained.

Separately, a woven fabric of glass fiber was impregnated with epoxy resin and heated to evaporate the solvent to produce a prepreg. This prepreg was cut in pieces. Those pieces were laminated and a modified epoxy resin adhesive-coated copper foil was placed on the top of the pieces to insert into the press, followed by heating and pressing to cure. That way, copper-coated laminated plate was obtained.

The laminated plate was immersed into a decomposing fluid prepared by adding 2 parts by weight of calcium oxide per 100 parts by weight of ethylene glycol and heated for 5 hours at 250° C.

The binder resin was decomposed and dissolved in the decomposing fluid or evaporated, leaving the laminated plate base, kraft paper, glass fiber woven fabric and copper foil. The glass fiber woven fabric was in the state that the fabric could be easily separated in the original number of pieces that had been put together in the step of producing the laminated plate.

As shown, the cured resin-containing waste article, laminated plate with the thermosetting epoxy and phenol resins as binder can be decomposed quickly in a decomposing fluid of ethylene glycol with calcium oxide.

Example 9

There will now be explained a first embodiment of the apparatus of the present invention for decomposition treating the waste article having cured thermosetting resin with reference to FIG. 1.

The apparatus comprises a hopper 1 for feeding cured thermosetting resin article, a hopper 2 for feeding the decomposing fluid, and a decomposition bath 3 for mixing and extruding the article and the decomposing fluid fed from those hoppers. The decomposition bath 3 is cylindrical in shape with one end opened as nozzle 4 with a uniaxial screw 5 for extrusion installed inside and spiral heater 6 to heat placed outside.

First, the same articles with unsaturated polyester resin as binder as tested in Example 1 were roughly crushed into a grain size of not larger than 1 mm and put in the hopper 1. And ethylene glycol was poured into the hopper 2. After the inside of the decomposition bath was heated to 300° C. by the spiral heater 6, the screw 5 was rotated and the article and the decomposition were fed continuously into the decomposition bath.

The decomposing fluid was fed in such a quantity that the cured thermosetting resin portion of the article got wet. The article was kneaded with the decomposing fluid and subjected to shearing stress by the rotation of the screw and continuously extruded out of the nozzle 4, which was an opening of the decomposition bath. At that time, the article was in the embrittled state and grains or glass fibers were exposed. An analysis of the extruded particles indicated that the ester bond and crosslinked chain of the binder unsaturated polyester resin was chemically cut or broken. Since the binder was decomposed, the filler could be separated and recovered with ease. The components in the binder were also possible to recover.

The decomposing and processing apparatus of the present invention can continuously decompose cured resin article with thermosetting resin as binder, permitting easy recovery of the respective components for reuse. In the present example, aluminum hydroxide, the filler in the cured resin that was the object for the decomposing treatment, would not be dehydrated into aluminum oxide when heated in the process but was recovered as aluminum hydroxide and could be reused as flame-retardant filler.

Figure 2:
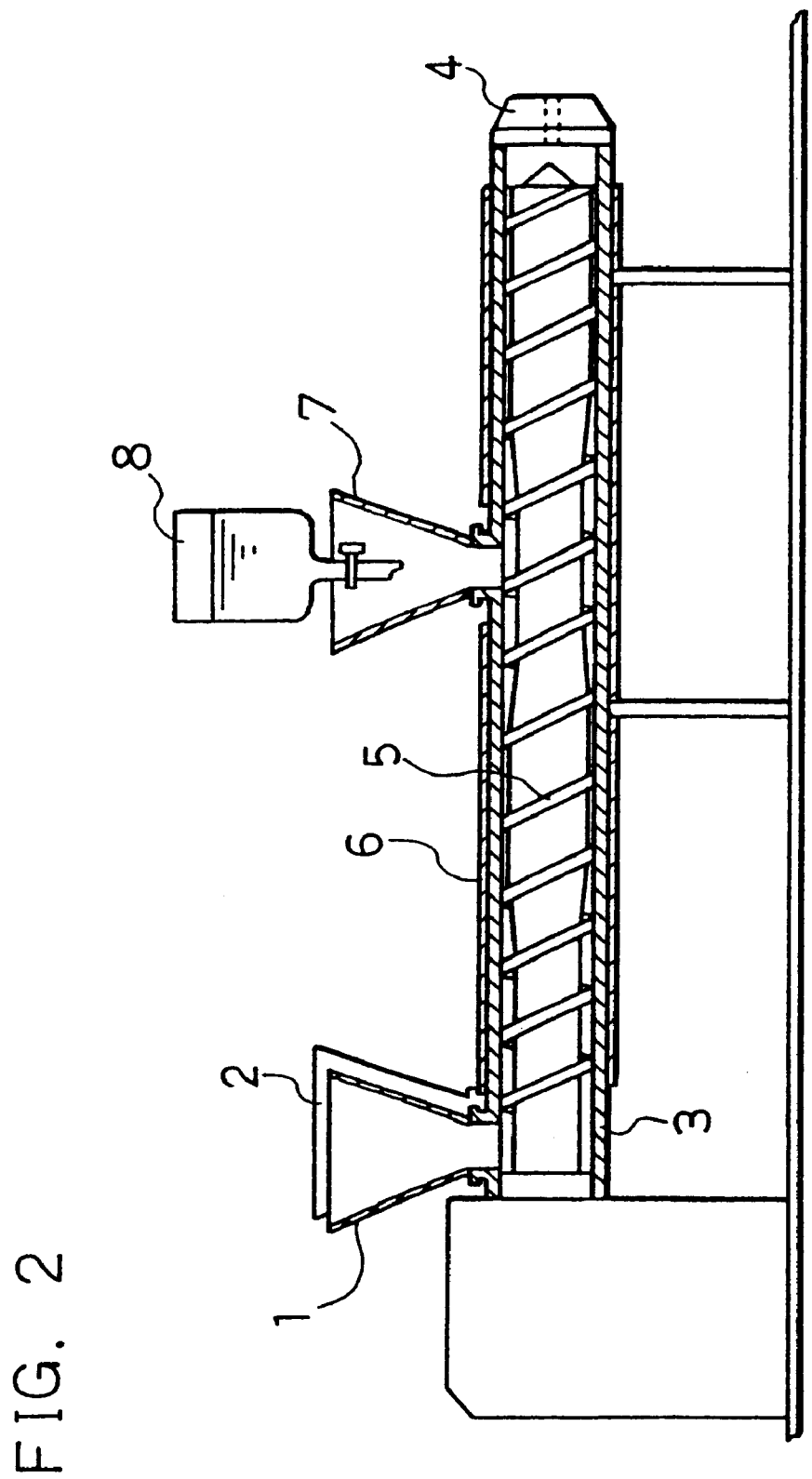
FIG. 2 is a schematic vertical, sectional view of an apparatus of another embodiment of the present invention for decomposition treating articles having cured thermosetting resin.

To add the decomposing fluid to the article being heated and extruded (being kneaded with the decomposing fluid), an opening 7 for a supplementary feeder to feed the decomposing fluid may be provided midway in the decomposition bath as shown in FIG. 2. It is to be understood that the present invention is not limited to the constitution of the extruder, heater and decomposing fluid supplementary feeder which have been described in the present example.

Example 10

Figure 3:
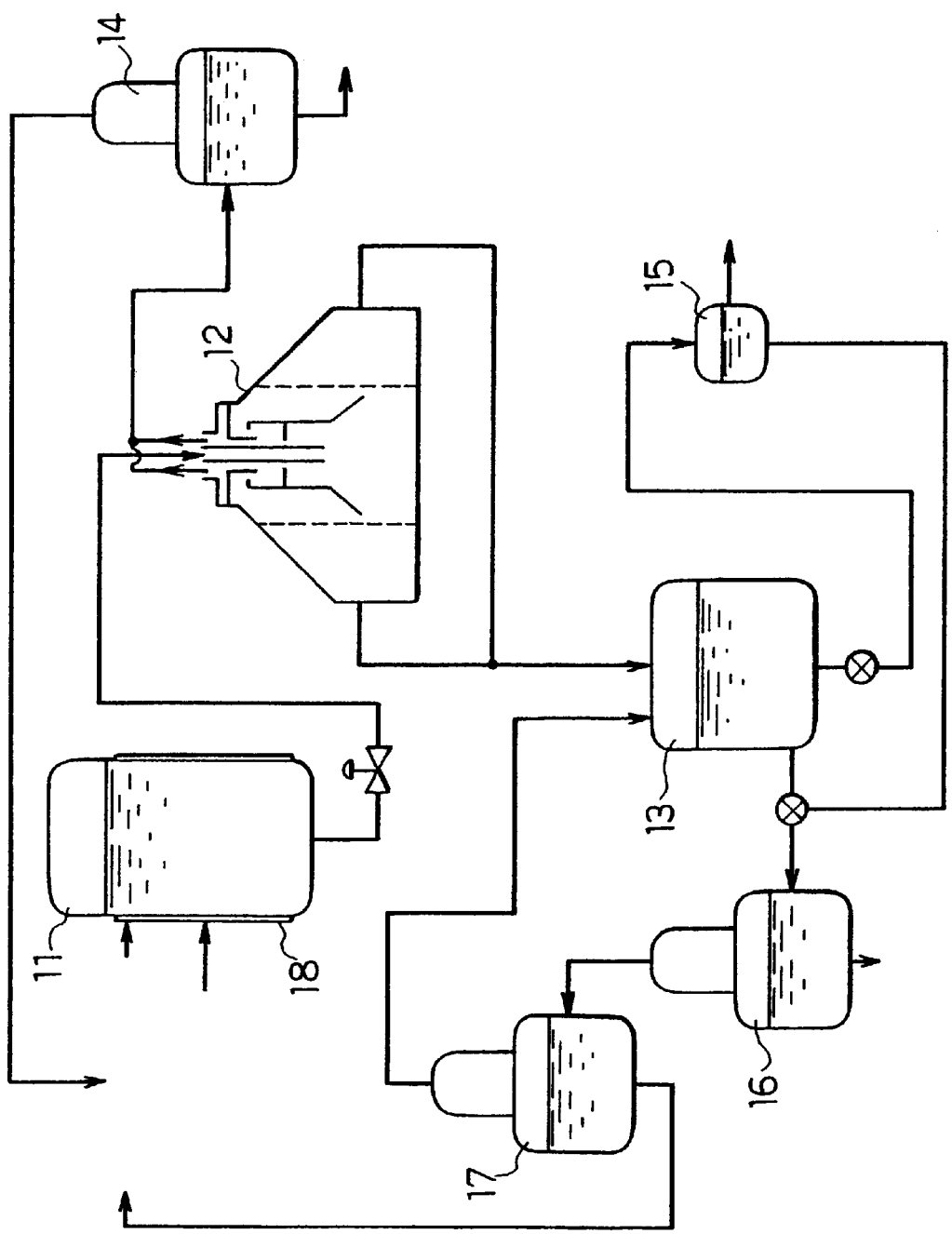
FIG. 3 is a flow diagram showing the respective steps of the method for decomposition treating articles having cured thermosetting resin according to the present invention.

A second embodiment of the apparatus of the present invention for decomposition treating the waste article having cured thermosetting resin will be described with reference to FIG. 3.

The apparatus comprised a decomposition bath 11, a second solid-liquid separation bath 12 and a third bath 13. The decomposition bath 11 was for immersing and heating the article with thermosetting resin as binder in a decomposing fluid. The second solid-liquid separation bath 12 was for centrifugally separating the insoluble components from the decomposing fluid, in which the soluble contents have been dissolved by heating in the decomposition bath. And, the third bath 13 was for dissolving and separating the solid components. The decomposing apparatus in this example was also equipped with a first distillation tower 14, a drying bath 15, a second distillation tower 16 and a third distillation tower 17. The first distillation tower 14 was for separating the decomposition solvent component and the dissolved matters derived from the decomposed cured thermosetting resin article by distillation of the solution from the solid-liquid separation bath 12. The drying bath 15 was for removing by distillation the remaining solvent component from the insoluble solid contents from the dissolving and separation bath 13. The second distillation tower 16 was for separating the dissolved resin contents by distilling off the solvent from the solution arising from the dissolving and separation tower 13. And, the third distillation tower 17 was for further separating the solvent component coming in from the tower 13. The decomposition bath was mounted with a heater 18 for heating the cured thermosetting resin article and the decomposing fluid to a temperature not lower than 250° C. and lower than the critical temperature of the solvent.

When 100 g of cylindrical pieces obtained in Example 1 was immersed in the decomposition bath 11, which was filled with a decomposing fluid comprising 500 g of ethylene glycol while keeping the fluid temperature at 300° C., those pieces completely collapsed within 10 hours. And, calcium carbonate, filler such as glass fiber and parts of the resin composition were observed deposited in the decomposing fluid.

Then, this preparation in the decomposition bath 11 was transferred to the solid-liquid separation bath 12 where the solution and the insoluble solid contents were separated. The solid contents included glass fiber, calcium carbonate and decomposed resin composition. The filtrate obtained by centrifugal separation in the solid-liquid separation bath 12 was transferred to the first distillation tower 14 and separated by distillation into the decomposing fluid ethylene glycol and the dissolved decomposed resin composition. Ethylene glycol was reused in the decomposition bath 11 as decomposing fluid. The dissolved decomposed resin composition included propylene glycol, which constituted unsaturated polyester resin and was possible to reuse as basic material for unsaturated polyester resin.

Meanwhile, the solid contents separated in the solid-liquid separation bath 12 was placed in the dissolving and separation bath 13 where the solid contents insoluble even in acetone were recovered as deposits.

The deposits were dried in the drying bath 15 and recovered. The deposits were found to contain little of the resin composition but almost nothing but the filler such as glass fiber, calcium carbonate and aluminium hydroxide.

The solvent distilled off by drying was transferred to the second distillation tower 16. The solvent from the dissolving and separation bath 13 was also transferred to the second distillation tower 16.

There, the solvent was separated from the dissolved resin composition derived from the decomposition products of the cured thermosetting resin. The recovered dissolved resin composition was reused as basic material for thermosetting resins.

The solvent was then transferred to the third distillation tower 17 and was separated into acetone and the residual ethylene glycol. Acetone was returned to the dissolving and separation bath 13 and reused as solvent. Ethylene glycol was transferred to the decomposition bath 11 and was reused as decomposing fluid.

As set forth above, the decomposition treating apparatus of the present invention can decompose the above-mentioned cured thermosetting resin article and at the same time separate the decomposed article into the respective components, permitting recovery of the solvent, too. The respective separated components can be recycled for thermosetting resin article as basic material, the decomposition treatment thereof and other uses.

Aluminium hydroxide, the filler in the above-mentioned article, that was the object for the decomposing treatment, would not be dehydrated into aluminum oxide when heated in the process but was recovered as aluminum hydroxide and could be reused as inflammable filler.

It is to be understood that the equipment in the respective treatment units adopted in the decomposition treating apparatus is not limited to the constitution described in the present example. To accelerate the decomposition treatment, for example, a stirrer may be mounted in the decomposition 11.

The decomposing fluid from the decomposition bath may be treated batch-wise. That is, it may be so arranged that the whole quantity of decomposing fluid placed in the bath is retained there until after a number of cured thermosetting resin wastes are decomposed. Then the fluid is sent out of the decomposition bath for separation and other treatments. A continuous circulating system or arrangement may be also adopted. In this system, part of the decomposing fluid in the decomposition bath is continuously to separate the solid contents and the fluid and, then to distill off the solvent. And, then, the distilled fluid may be pumped back to the decomposition bath.

In case the purpose of treatment is to remove only part of the components present in the decomposing fluid from the decomposition step, only some portions of the decomposition treating apparatus of the present invention may be employed. Depending on the number of components making up the cured thermosetting resin article, the number of dissolving and separation baths may be increased to repeat the dissolving and separation treatment and to separate the solution more minutely.

Furthermore, it is possible to combine the arrangement in the present example with the decomposition treating apparatus in the above first embodiment of the present invention, thereby separating cured thermosetting resin article continuously. Other means such as separation based on gravity may also be employed.

An apparatus for some other step also may be placed before the decomposition treating apparatus of the present invention. Addition of a pre-treatment step for roughly crushing the article having cured thermosetting resin could shorten the treatment time in the decomposition bath.

Comparative Example 4

A cylindrical piece, each 20 mm in diameter, produced in Example 1 was dipped in water instead of the decomposing fluid and heated for 5 hours at 300° C. Then, measurements were taken of the penetration rate of water and the surface hardness of the cured thermosetting resin portion in the cylindrical piece after treatment.

Large cracks were developed in the cured piece but little water was found penetrating into the cured resin portion with little drop observed in hardness. It was found that no decomposing effect was expected by using water.

Comparative Example 5

A cylindrical piece, each 20 mm in diameter, produced in Example 1 was heated in air for 5 hours at 300° C. Then, a number of small cracks were observed in the cured piece with some subtle craters on the surface. But, the cylindrical form remained in the original state. That is, merely heating to 300° C. would not work.

Examples 11 and 12

First, 65 parts by weight of unsaturated polyester composed of phthalic anhydride, fumaric anhydride and propylene glycol was mixed with 35 parts by weight of styrene and then with 0.01 part by weight of the polymerization inhibitor methoxyhydroquinone and dissolved at room temperature to produce an unsaturated polyester resin.

Meanwhile, 36 parts by weight of polydipropylene adipate was mixed with 64 parts by weight of 2-hydroxyethyl methacrylate, followed by stirring and dissolving to produce a shrinkage controlling agent.

Then, 74 parts by weight of the unsaturated polyester resin prepared above was mixed with 26 parts by weight of the shrinkage controlling agent and 1 part by weight of a polymerization initiator 1,1-(t-butylperoxy)3,3,5-trimethylcyclohexane to produce a resin composition.

In the next step, 17.8 parts by weight of calcium carbonate and 48.5 parts by weight of aluminium hydroxide as the filler, 1.5 parts by weight of zinc stearate as the releasing agent and 0.4 parts by weight of carbon powder as the colorant were transferred into a kneading machine and dry mixed. Homogeneously mixed, the dry preparation was mixed little by little with 22 parts by weight of the resin prepared earlier to obtain a homogenous pasty mixture.

In this pasty mixture, 9.8 parts by weight of glass fiber was evenly dispersed in as short a time as possible. When the glass fibers got wet and dispersed uniformly, the kneading was finished and a molding compound was obtained.

An electromagnetic laminated steel plate with a electromagnetic coil put thereon was placed in a mold, and the molding compound was injected at a molding temperature of 150° C. to obtain a molded motor as an article having cured thermosetting resin. The largest molded portion thickness in the motor was 10 mm.

Then, the molded motor was dipped into a decomposition bath filled with a decomposing fluid of ethylene glycol.

Then, nitrogen gas was introduced into the decomposition bath from a nitrogen gas cylinder via a nozzle to replace the gas in the decomposition bath with nitrogen gas.

Thereafter, the decomposing fluid was heated to 300° C. for 5 hours (Example 11). In parallel, a separate test was carried out in the same procedure except that the gas in the bath was not replaced with nitrogen gas (Example 12).

The molded motors were taken out after five hours. The cured thermosetting resin portion of each molded motor was embrittled and swollen into the gel state and, thus, the resin portions could be peeled off without difficulty. That is, the electromagnetic parts such as the coil and the laminated sheet plate could be easily removed and recovered from the molded motor.

In the case of Example 11 wherein the gas was replaced with nitrogen gas, the maximum pressure within the decomposition bath during the decomposition treatment was 10 kg/cm$^2$, which was about the same level as that of ethylene glycol heated to 300° C. The decomposing fluid after treatment, except for the deposit resulted from the decomposition of the cured thermosetting resin, was colored in slightly brown.

In Example 12 wherein no gas substitution was performed, on the other hand, the maximum pressure in the decomposition bath during the decomposition treatment was more than 20 kg/cm$^2$ and a larger amount of decomposition gases was produced. And, the decomposing fluid was colored in deep brown. This indicated that the decomposing fluid had slightly degraded. When the generated gases were analyzed, aldehydes and other components, which were resulted from the oxidation of ethylene glycol, were detected. It was confirmed that an oxidation process had taken place.

Also, on copper and iron, which were the raw materials of the electromagnetic parts such as the coil of the electromagnetic laminated steel plate, a clearly less degree of oxidation and degradation was observed in Example 11 where the gas was replaced with nitrogen gas. Thus, the gas substitution step could improve the quality of metals to be recovered, too.

As shown in the present example, the decomposing fluid comprising ethylene glycol can decrease the hardness of cured thermosetting resin portions of the molded motor with unsaturated polyester resin as binder, and the resin portions can be peeled off by hand. Furthermore, a nitrogen gas substitution step could decrease the pressure during the decomposition treatment and decrease the degradation of the decomposing fluid and the generation of decomposition gases. Furthermore, the gas substitution could minimize the oxidation of copper and iron, thus, improving the quality of metals to be recovered.

In the present example, molded motors were treated in the original form. A pre-treatment such as rough crushing and cutting may be placed before the decomposition treatment. The step could reduce the thickness of cured resin portion from the surface and save the period of time of dipping in the decomposing fluid.

Examples 13 to 16 and Comparative Examples 6 to 8

In the present examples, laminated plates with epoxy resin as binder were put to decomposition treatment.

Woven fabrics comprising glass fiber were impregnated with epoxy resin and heated to evaporate the solvent to produce prepregs. The prepreg was cut in pieces to be laminated and a modified epoxy resin adhesive-coated copper foil was placed on the top of the laminated pieces and, then, the lamination was inserted into a press and cured by heating and pressing to obtain a copper-coated laminated plate.

In the present examples, a decomposing fluid comprising ethylene glycol was used. The laminate plate was placed in the decomposition bath filled with that decomposing fluid and the decomposition bath was closed air-tightly. Then, by means of a vacuum pump connected to a nozzle provided in the decomposition bath, the gas was evacuated to reduce the internal pressure of the decomposition bath. Then, the decomposition bath was heated for 5 hours at 270° C. (Example 13).

Parallel tests were carried out at different temperatures of 200° C. (Comparative Example 6), 230° C. (Comparative Example 7), 240° C. (Comparative Example 8). 250° C. (Example 14) and 300° C. (Example 15). In addition, separate test was conducted in the same procedure at 270° C. except that the evacuation by vacuum pump was omitted (Example 16).

In the examples with treatment conducted at 200, 230 and 240° C., little change was observed in strength of the copper-coated laminated plates and their original forms were remained, though traces of color changes were found in the cured thermosetting resin portion.

In the examples where the treatment temperatures were not lower than 250° C., that is 250, 270 and 300° C., on the other hand, the binder resin was completely decomposed and dissolved or dispersed in the decomposing fluid. And, woven fabrics comprising glass fiber and copper foils as the base materials were released from the laminated plate.

The glass fiber woven fabrics were so decomposed that the fabrics could be easily separated into the original number of pieces that had been laminated in the step of making laminated plates. In the example where treatment was carried out at 270° C. without evacuation by vacuum pump, too, the laminated plate was decomposed, releasing only the base materials, glass fiber woven fabrics and copper foil.

In the example where the decomposition bath was evacuated, the maximum pressure within the bath during the decomposition treatment was 10 kg/cm², which was about the same level as that of ethylene glycol heated to 300° C. The decomposing fluid after treatment except for the deposit resulted from the decomposition of the cured thermosetting resin was colored in slight brown.

In Examples wherein no nitrogen gas substitution was performed, on the other hand, the maximum pressure in the decomposition bath during the decomposition treatment was more than 20 kg/cm² and a larger amount of decomposition gases was produced. And, the decomposing fluid after the treatment was colored in deep brown, which indicated that the decomposing fluid was further degraded.

Also, a clearly less degree of oxidation and degradation was observed on the copper foils separated and recovered from the evacuated baths. The glass fiber woven fabrics treated in the evacuated baths, too, were found the less stained and the easier to wash because the decomposing fluid was less degraded.

As shown, the present invention could fast decompose the laminated plate, a cured resin article having the thermosetting epoxy resin as binder. An evacuation of the bath furthermore could decrease the pressure during the decomposition treatment and decrease the degradation of the decomposing fluid and generation of decomposition gases. Furthermore, the gas substitution could minimize the oxidation of the base materials such as copper and glass fabrics, thus improving the quality of metals to be recovered.

Therefore, the present treatment method involving the evacuation of the decomposition bath and the heating to not lower than 250° C. is better. This is because the cured thermosetting resin portions are peeled and separated without difficulty and metals like copper foil and base materials such as glass fabrics are easily recovered with improved quality. Further, the decomposing fluid is less degraded.

It is preferable that the evacuation is carried out to as low as vacuum, preferably not higher than 10 mmHg. In a treatment under such conditions, it is possible to decompose the base materials such as polyester, nylon and acrylic resins, similarly.

Examples 17 to 19

The present examples describe the decomposition of printed circuit boards, articles having phenol resin as binder.

A kraft paper was impregnated with phenolic varnish and heated to evaporate the solvent to produce a prepreg. This prepreg was cut in pieces to be laminated, inserted into the press, and cured by heating and pressing to obtain a laminated plate.

A conductive pattern was formed on the copper-coated laminated plate by circuit printing, etching and other steps, and electronic devices were mounted to produce a printed circuit board.

In the present examples, a decomposing fluid was prepared by adding hydroquinone as antioxidant to propylene glycol. In concrete, 1 part by weight of hydroquinone was added to 100 parts by weight of propylene glycol.

The printed circuit board was dipped in the decomposing fluid. Evacuated by the vacuum pump, the decomposition bath was heated for 5 hours at 270° C. (Example 17). Parallel tests were carried out by using a decomposing fluid comprising propylene glycol alone without addition of hydroquinone (Example 18) and by using a decomposing fluid comprising propylene glycol only without evacuation (Example 19).

Under either of the test conditions, the binder or cured thermosetting resin was decomposed, dissolved or dispersed. And, portions of the base material kraft paper was decomposed into deformed carbonized state and the lamination was peeled off.

Additionally affected by the force resulting from deformation, the copper foil and electronic devices were found separated in the decomposing fluid. Thermosetting resins such as polybutylene terephthalate, which constituts the electronic devices, were found fallen in the solution.

It is noted that the pressure during decomposition reaction was varied depending on the three kinds of conditions. The pressure was 60 kg/cm² in the example when the treatment was performed with propylene glycol without evacuation of the bath, 30 kg/cm$^2$ when the treatment was performed under the same conditions with the evacuation of the bath, and 20 kg/cm$^2$ when the treatment was performed under the same condition with the evacuation of the bath and the addition of hydroquinone.

The results indicate that the bath evacuation and addition of hydroquinone could decrease the amount of generated gases in the decomposition process. Namely, it is possible to decrease the generation of gases due to the decomposition and degradation of the secondary decomposing fluid comprising propylene glycol. It means that the degradation of the decomposing fluid could be decreased. The decomposing fluid would be easier to recover for recycling, because the cured thermosetting resin would be rendered in the form of solid or liquid.

An examination of the decomposing fluids after the decomposition treatment showed that the fluid was most stained and colored in black with odor when the treatment was carried out by using propylene glycol without the evacuation of the bath. In the example where the bath was evacuated or hydroquinone was added to the fluid, the decomposing fluid was less contaminated without much odor.

A comparison of recovered and separated copper foils treated under three different conditions showed that original gloss was retained in the samples treated in the bath evacuated and/or given an addition of hydroquinone. In contract, oxidation was observed on the surface of the copper foil recovered from the treatment performed with propylene glycol alone without the evacuation of the bath. There were many stains on the copper foil because of the degradation of the decomposing fluid.

As shown, the decomposing fluid comprising propylene glycol could quickly decompose the printed circuit board, an article having thermosetting phenol resin as binder, into the resin components and the base material, permitting separation and recovery of the copper foil and electronic devices. It is also noted that the present invention permits recovery of recyclable components and volume reduction of printed circuit board and is just suited for the treatment of boards containing phenol resin.

Furthermore, the present invention can decrease the degradation of the decomposing fluid by evacuating the decomposition bath and/or by adding hydroquinone, permitting recovery of metals and others with the quality improved. In the present invention, furthermore, the generation of gases can be controlled, and therefore the pressure will not arise so much and the decomposition bath is not required to be resistant to high pressure.

Examples 20 and 21

In the present example, the printed circuit boards having epoxy resin as binder, which were further coated with urethane resin, were put to decomposition treatment.

Glass nonwoven fabrics (Example 20) and glass woven fabrics (Example 21) were impregnated with epoxy resin varnish and heated to evaporate the solvent to produce two prepregs. Each prepreg was cut in pieces to be laminated and inserted into a press with copper foil thereon, heated and pressed to cure phenol resin. Thus, a copper-coated laminated plate was obtained.

A conductive pattern was formed on the copper-coated laminated plate by circuit printing, etching and other steps, and electronic devices were mounted to produce a printed circuit board. The printed circuit board was coated with urethane resin at the thickness of about 2 cm.

Thus obtained each printed circuit board was dipped into a tetralin decomposing fluid and heated for five hours at 280° C.

In this treatment, the urethane resin was first completely decomposed and dissolved in the solvent, and the epoxy resin was also found decomposed and dissolved or dispersed in the decomposing fluid. The lamination layers of the base materials, woven fabrics and nonwoven fabrics, were observed peeled off.

The released copper foil and electronic devices by the decomposition of the cured thermosetting resin were separated from the lamination in the decomposing fluid.

The thermosetting resins such as polybutylene terephthalate that constitute the electronic device were found fallen in the fluid. Solder for mounting the electronic devices was recovered as was adhered on the copper foil.

As shown, the present invention could quickly decompose the resin portion of the printed circuit board, a cured resin article having the thermosetting epoxy resin as binder, which is coated with urethane resin, through a decomposition treatment in the tetralin decomposing fluid.

In the present example, no pre-treatment was performed in the decomposition bath before the decomposition treatment. But in the case that even slight oxidation of the contained metals could be a problem, the decomposition bath may be evacuated or the gas in the bath may be replaced with nitrogen gas as mentioned earlier. Also, it is possible to replace the gas in the bath with nitrogen gas, followed by the evacuation of the bath. The treatments could further control oxidation and degradation.

It is also noted that the decomposing fluid, after repeated use can be separated from the dissolved components to be recycled or can be used as fuel oil.

Comparative Examples 9 and 10

In these examples, the laminated plates having epoxy resin as binder, which were obtained in the same manner as in Example 9, were dipped into a decomposing fluid comprising liquid paraffin and heated for 5 hours at 300° C.

Then, measurements were taken of as to the penetration rate of decomposing fluid and the surface hardness of the cured thermosetting resin after dipping treatment in the decomposing fluid. No penetration into the cured resin portion of the decomposition was observed with no change in appearance and no drop in hardness. That means that n-tetradecane or liquid paraffin is not effective as decomposing fluid.

As set forth above, the decomposition treating method of the present invention can decompose article having cured thermosetting resin without difficulty.

The decomposition treating apparatus according to the present invention can continuously decompose or separate cured resins into the respective components suitable for reuse, thus helping reduce the volume of the waste article by efficient decomposition treatment.

What is claimed is:

1. A method of decomposition treating a waste article having cured thermosetting resin which comprises at least one selected from the group consisting of cured epoxy resin, cured phenol resin and cured polyurethane resin, said method comprising the steps of:

(a) bringing the waste article having cured thermosetting resin into contact with a decomposing fluid containing a solvent, which decomposes the cured thermosetting resin when heated, in a decomposition bath and (b) heating the decomposing fluid at a temperature not lower than 250° C. and lower than the critical temperature of the solvent.

2. The method of decomposition treating a waste article having cured thermosetting resin in accordance with claim 1, wherein said decomposing fluid is brought into contact with said waste article after vaporized.

3. The method of decomposition treating a waste article having cured thermosetting resin in accordance with claim 1, further comprising a step (a') of removing oxygen from said decomposition bath after said step (a) and before said step (b).

4. The method of decomposition treating a waste article having cured thermosetting resin in accordance with claim 3, wherein said step (a') comprises the step of replacing gas in said decomposition bath with nitrogen gas and/or evacuating the bath to reduce the internal pressure.

5. The method of decomposition treating a waste article having cured thermosetting resin in accordance with claim 1, wherein said solvent decomposes the cured thermosetting resin by solvolysis or catalytic action.

6. The method of decomposition treating a waste article having cured thermosetting resin in accordance with claim 1, wherein said solvent is at least one selected from the group consisting of ethylene glycol, propylene glycol, diethylene glycol, dipropylene glycol, isoprene glycol, triethylene gylocol, tetraethylene glycol, 2-methoxyethanol, 2-ethoxyethanol, 2-dimethoxyethanol, 2-isopropoxyethanol, 2-buthoxyethanol, 2-isopenthyloxyethanol, 2-hexyloxyethanol, 2-phenoxyethanol, 2-benzyloxyethanol, 1-methoxy-2-propanol, 1-ethoxy-2-propanol, diethylene glycol monomethyl ether, diethylene glycol monoethyl ether, diethylene glycol monobutyl ether, dipropylene glycol monomethyl ether, dipropylene glycol monoethyl ether, triethylene glycol monomethyl ether and tripropylene glycol monomethyl ether.

7. The method of decomposition treating a waste article having cured thermosetting resin in accordance with claim 1, wherein said solvent is at least one selected from the group consisting of tetralin, biphenyl, napthalene, 1,4-hydroxynaphthalene, naphthol, 1,4-naphthoquinone, pitch, creosote oil, methyl isobutyl ketone, isophorone, 2-hexanone, 2-heptanone, 4-heptanone, diisobutyl ketone, acetonyl acetone, phorone, cyclohexanone, methylcyclohexanone and acetophenone.

8. The method of decomposition treating a waste article having cured thermosetting resin in accordance with claim 6, wherein said decomposing fluid in the step (a) contains calcium oxide.

9. The method of decomposition treating a waste article having cured thermosetting resin in accordance with claim 8, wherein the content of calcium oxide is not higher than 10 parts by weight per 100 parts by weight of the solvent in said decomposing fluid.

10. The method of decomposition treating a waste article having cured thermosetting resin in accordance with claim 8, further comprising a step (f) of neutralizing said decomposing fluid, which contains calcium oxide, by adding carbon dioxide to a solution obtained in said step (a).

11. The method of decomposition treating a waste article having cured thermosetting resin in accordance with claim 1, wherein said decomposing fluid in the step (a) contains an antioxidant or reducing agent.

12. The method of decomposition treating a waste article having cured thermosetting resin in accordance with claim 11, wherein said antioxidant or reducing agent is at least one selected from the group consisting of hydroquinone, methoquinone, benzoquinone, naphthoquinone, butyl catechol, butyl hydroquinone, sodium hypophosphite, sodium thiosulfate and ascorbic acid.

13. The method of decomposition treating a waste article having cured thermosetting resin in accordance with claim 1, wherein said waste article in the step (a) is a molded motor or a molded transformer, which contains a metallic component.

14. The method of decomposition treating a waste article having cured thermosetting resin in accordance with claim 1, wherein said waste article in the step (a) is a laminated resin article obtained by laminating and molding prepregs, each of which is prepared by impregnating with a thermosetting resin at least one base material selected from the group consisting of a fabric or non-woven fabric made of glass fiber, polyester fiber, polyamide fiber, acrylic fiber or aramid fiber, paper such as mica paper or linter paper, cotton fabric and asbestos.

15. The method of decomposition treating a waste article having cured thermosetting resin in accordance with claim 14, wherein said laminated resin article is a printed circuit board having a copper pattern formed thereon and an electronic device mounted thereon.

16. The method of decomposition treating a waste article having cured thermosetting resin in accordance with claim 1, wherein the step (b) is followed by a step (c) of separating solid contents from liquid contents of a mixture of the cured thermosetting resin heated and the decomposing fluid, a step (d) of obtaining a solution by dissolving the separated solid contents, and a step (e) of separating residual solid contents from the solution.

17. The method of decomposition treating a waste article having cured thermosetting resin in accordance with claim 16, wherein the separated solid contents are dissolved in at least one solvent selected from the group consisting of acetone, acetyl acetone, acetaldehyde, ethyl acetoacetate, methyl acetoacetate, methyl ethyl ketone, diethyl ketone, methyl isobutyl ketone, methyl isopropyl ketone, dimethyl sulfoxide, dimethyl formamide, ethyl acetate, isopropyl acetate, butyl acetate, tetrahydrofuran, dioxane, diethyl ether, water, ethanol and methanol in the step (d).

18. A method of decomposition treating a waste article having cured unsaturated polyurethane resin, said method comprising the steps of:

(a) bringing said waste article having cured unsaturated polyurethane resin into contact with a decomposing fluid containing a solvent in a decomposition bath, said solvent being selected from the group consisting of 2-methoxyethanol, 2-ethoxyethanol, 2-dimethoxyethanol, 2-isoproxyethanol, 2-butoxyethanol, 2-isopentyloxyethanol, 2-hexyloxyethanol, 2-phenoxyethanol, 2-benzyloxyethanol, 1-methoxy-2-propanol, 1-ethoxy-2-propanol, diethylene glycol monomethyl ether, diethylene glycol monoethyl ether, diethylene glycol monobutyl ether, dipropylene glycol monomethyl ether, dipropylene glycol monoethyl ether, triethylene glycol monomethyl ether, and tripropylene glycol monomethyl ether; and (b) heating said decomposing fluid at a temperature not lower than 250° C. and lower than the critical temperature of said solvent.

19. A method of decomposition treating a waste article having cured unsaturated polyurethane resin, said method comprising the steps of:

(a) bringing said waste article having cured unsaturated polyurethane resin into contact with a decomposing fluid containing a solvent in a decomposition bath, said solvent being selected from the group consisting of tetralin, biphenyl, naphthalene, 1,4-hydroxynaphthalene, naphthol, 1,4-naphthoquinone, pitch, creosote oil, methyl isobutyl ketone, isophorone, 2-hexanone, 2-heptanone, 4-heptanone, diisobutyl ketone, acetonyl acetone, phorone, cyclohexanone, methylcyclohexanone and acetophenone; and (b) heating said decomposing fluid at a temperature not lower than 250° C. and lower than the critical temperature of said solvent.

* * * * *